United States Patent
Liu et al.

(10) Patent No.: US 12,308,068 B2
(45) Date of Patent: May 20, 2025

(54) CONTROL CIRCUIT AND MEMORY

(71) Applicant: CHANGXIN MEMORY TECHNOLOGIES, INC., Hefei (CN)

(72) Inventors: Lu Liu, Hefei (CN); Jixing Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 107 days.

(21) Appl. No.: 18/451,069

(22) Filed: Aug. 16, 2023

(65) Prior Publication Data

US 2024/0127880 A1   Apr. 18, 2024

Related U.S. Application Data

(63) Continuation of application No. PCT/CN2022/129777, filed on Nov. 4, 2022.

(30) Foreign Application Priority Data

Oct. 12, 2022   (CN) .......................... 202211247767.5

(51) Int. Cl.
   *G11C 11/00*  (2006.01)
   *G11C 11/406*  (2006.01)

(52) U.S. Cl.
   CPC ............... *G11C 11/40622* (2013.01); *G11C 11/40615* (2013.01)

(58) Field of Classification Search
   CPC .............. G11C 16/3436; G11C 29/44; G11C 11/406; G11C 2029/0401; G11C 29/08;
   (Continued)

(56) References Cited

U.S. PATENT DOCUMENTS 10,170,174 B1   1/2019   Ito
10,446,216 B2   10/2019  Oh
(Continued)

FOREIGN PATENT DOCUMENTS

| CN | 111052243 A | 4/2020 |
|---|---|---|
| CN | 112352280 A | 2/2021 |
| CN | 114822633 A | 7/2022 |

OTHER PUBLICATIONS

International Search Report in the international application No. PCT/CN2022/129777, mailed on Dec. 27, 2022. 9 pages with English translation.
(Continued)

*Primary Examiner* — Thong Q Le
(74) *Attorney, Agent, or Firm* — Syncoda LLC; Feng Ma

(57) ABSTRACT

A control circuit is provided, including a random module and an output module. A first input terminal of the random module receives a refresh count signal, a second input terminal receives random data, and a control terminal is connected to an output terminal of the output module. The random module processes the refresh count signal and the random data based on a row hammer refresh (RHR) signal output by the output module to obtain and output a random signal. A first input terminal of the output module receives the refresh count signal, a second input terminal is connected to an output terminal of the random module. The output module generates and outputs the RHR signal according to the random signal and the refresh count signal.

16 Claims, 5 Drawing Sheets

(58) Field of Classification Search
CPC .......... G11C 29/12005; G11C 29/1201; G11C 29/52; G11C 11/4063; G11C 11/40615; G11C 11/40622; G11C 2207/16; G11C 7/20; H01L 2223/54433; H01L 2223/5444; H01L 2223/54473; H01L 23/544; H01L 23/576; H01L 2924/0002; H01L 2924/00; H01L 21/02; H04L 2209/34; H04L 2209/42; H04L 9/0897; H04L 9/3278; H04L 63/0428; H04L 63/08
See application file for complete search history.

(56) References Cited

U.S. PATENT DOCUMENTS

| | | | |
|---|---|---|---|
| 10,573,370 | B2 | 2/2020 | Ito |
| 10,885,966 | B1 | 1/2021 | Devaux |
| 2017/0011792 | A1 | 1/2017 | Oh |
| 2019/0139599 | A1 | 5/2019 | Ito |
| 2020/0005857 | A1 | 1/2020 | Ito |
| 2020/0176050 | A1 | 6/2020 | Ito |
| 2022/0270672 | A1* | 8/2022 | Kim .................. G11C 11/40603 |

OTHER PUBLICATIONS

S. M. Seyedzadeh, A. K. Jones and R. Melhem, "Counter-Based Tree Structure for Row Hammering Mitigation in DRAM," in IEEE Computer Architecture Letters, vol. 16, No. 1, pp. 18-21, Jan. 1-Jun. 2017, doi: 10.1109/LCA.2016.2614497. 4 pages.

E. Lee, S. Lee, G. E. Suh and J. H. Ahn, "TWiCe: Time Window Counter Based Row Refresh to Prevent Row-Hammering," in IEEE Computer Architecture Letters, vol. 17, No. 1, pp. 96-99, Jan. 1-Jun. 2018, doi: 10.1109/LCA.2017.2787674. 4 pages.

* cited by examiner

CONTROL CIRCUIT AND MEMORY

CROSS-REFERENCE TO RELATED APPLICATIONS

This is a continuation of International Patent Application No. PCT/CN2022/129777 filed on Nov. 4, 2022, which claims priority to Chinese Patent Application No. 202211247767.5 filed on Oct. 12, 2022. The disclosures of the above-referenced applications are hereby incorporated by reference in their entirety.

BACKGROUND

In the memory, when a word line corresponding to a row address in the memory cell is frequently turned on, a leakage rate of capacitors at adjacent addresses may be higher than the natural leakage rate, which may lead to data loss of the capacitors at adjacent addresses due to excessive charge loss before the capacitors receive a refresh signal. This situation is generally called "row hammer effect".

In order to suppress the row hammer effect, it is necessary to timely refresh the row hammer address to recharge and avoid errors in stored data. This refresh operation is called row hammer refresh (RHR). Because no related refresh command is provided in the standard, the RHR can only be realized by means of a regular refresh operation. Usually, a RHR is performed after multiple regular refreshes.

SUMMARY

Embodiments of the present disclosure provide a control circuit. The control circuit includes a random module and an output module.

A first input terminal of the random module receives a refresh count signal, a second input terminal of the random module receives random data, and a control terminal of the random module is connected to an output terminal of the output module, and the random module is configured to process the refresh count signal and the random data based on a row hammer refresh (RHR) signal output by the output module to obtain and output a random signal.

A first input terminal of the output module receives the refresh count signal, and a second input terminal of the output module is connected to an output terminal of the random module. The output module is configured to generate and output the RHR signal according to the random signal and the refresh count signal.

Another embodiment of the present disclosure provides a memory, including the control circuit described in the above embodiments.

The control circuit provided by the present disclosure includes a random module and an output module. A control terminal of the random module is connected to an output terminal of the output module, and an output terminal of the random module is connected to a second input terminal of the output module. The random module is configured to process the refresh count signal and the random data based on RHR signal output by the output module to obtain and output the random signal. The output module is configured to generate and output the RHR signal according to the random signal and the refresh count signal. The refresh count signal determines the fixed RHR frequency, and the frequency of the RHR signal is changed by the random signal on the basis of the fixed refresh frequency, thereby reducing the risk of hackers changing stored data by using the row hammer attack.

BRIEF DESCRIPTION OF THE DRAWINGS

The drawings are incorporated in the description and form a part of the description. The drawings illustrate embodiments consistent with the present disclosure and, together with the description, serve to explain the principles of the present disclosure.

REFERENCE NUMERALS

Figure 1:
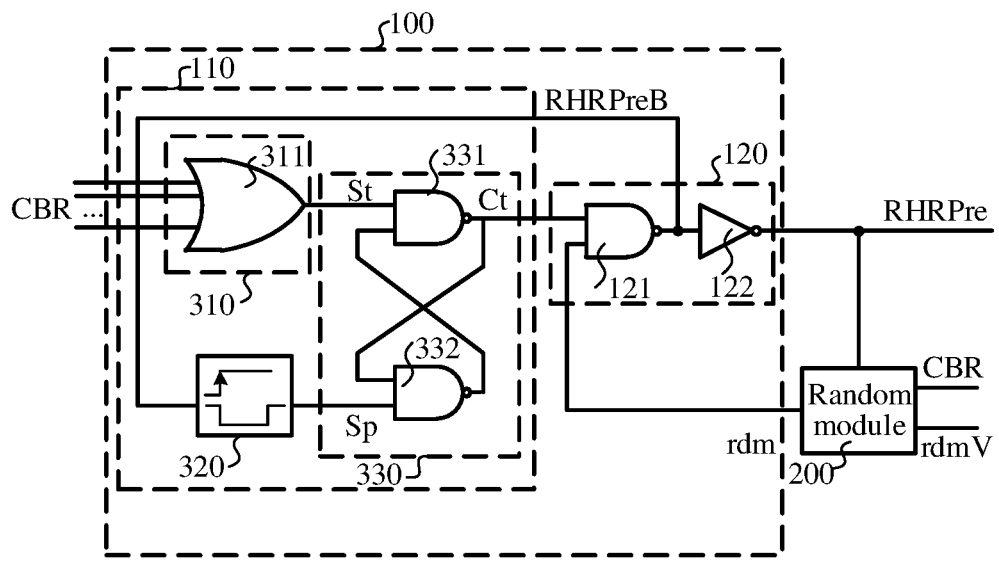
FIG. 1 is a schematic diagram of a control circuit according to an embodiment of the present disclosure.

100: Output module
110: Period control signal generating unit
120: RHR signal generating unit
121: Fourth NAND gate
122: Third inverter
200: Random module
210: Control unit
220: Random signal generating unit
310: Starting trigger circuit
311: OR gate
320: Termination trigger circuit
321: First delay circuit
322: First inverter
323: First NAND gate
324: Fourth inverter
325: First buffer
330: First latch
331: Second NAND gate
332: Third NAND gate
410: First trigger circuit
411: Second delay circuit
412: Second inverter
413: NOR gate
414: Fifth inverter
415: Second buffer
420: Second latch
430: Decoder
440: Selector The specific embodiments of the disclosure have been described through the above drawings, and more detailed descriptions for the embodiments will be made later. These drawings and text are not intended to limit the scope of the disclosure in any way, but to explain concepts of the disclosure to persons skilled in the art with reference to the specific embodiments.

DETAILED DESCRIPTION

Exemplary embodiments will be described here in detail, and examples thereof are represented in the accompanying drawings. When the following description relates to the accompanying drawings, unless otherwise indicated, the same numbers in different accompanying drawings represent the same or similar elements. Implementations described in the following exemplary embodiments do not represent all implementations consistent with the disclosure. On the contrary, they are only examples for devices and methods consistent with same aspects of the disclosure as detailed in the attached claims.

Usually, one RHR is performed after several refreshes. A count value of a refresh counter is monitored, and when the count value of the refresh counter is a set value, a RHR operation is performed. For example, the refresh counter is a 3-bit counter, and the refresh count signal CBR output by the refresh counter is marked as CBR<2:0>. When the count value of CBR<2:0> is zero, one RHR operation is performed, so that one RHR is performed after eight refreshes. That is, the RHR frequency is 1/8.

However, the above RHR frequency is fixed, and there is still a risk of row hammer attack. The present disclosure provides a solution for changing RHR frequency to reduce the risk of hackers changing stored data by using the row hammer attack.

As illustrated in FIG. 1, an embodiment of the present disclosure provides a control circuit. The control circuit includes a random module 200 and an output module 100.

The random module 200 includes a first input terminal, a second input terminal and a control terminal. The first input terminal of the random module 200 receives a refresh count signal CBR. The second input terminal of the random module 200 receives random data rdmV. The control terminal of the random module 200 is connected to an output terminal of the output module 100.

A first input terminal of the output module 100 receives the refresh count signal CBR, and a second input terminal of the output module 100 is connected to an output terminal of the random module 200.

The random module 200 is configured to process the refresh count signal CBR and the random data rdmV based on a RHR signal RHRPre output by the output module 100 to obtain and output a random signal rdm. The random signal rdm output by the random module 200 is used for changing the RHR frequency. The output module 100 is configured to generate and output the RHR signal RHRPre according to the random signal rdm and the refresh count signal CBR, such that the frequency for outputting the RHR signal RHRPre varies randomly.

In some embodiments, the output module 100 generates a period control signal Ct when the refresh count signal CBR is a specific value. The output module 100 processes the random signal rdm and the period control signal Ct to output the RHR signal RHRPre, so as to change the RHR frequency by randomly adding and subtracting from a fixed RHR frequency and avoid the RHR frequency from being too large or too small.

In some embodiments, the random module 200 updates the random signal rdm output by the output terminal of the random module 200 after the RHR signal RHRPre changes from an active state to an inactive state. When the RHR signal RHRPre is in the active state, the RHR operation is performed. As the refresh count value CBR changes, the random signal rdm changes to an inactive state, the RHR signal RHRPre obtained based on the refresh count signal CBR and the random signal rdm changes from the active state to the inactive state, and simultaneously, the random module 200 updates the random signal rdm output by the output terminal of the random module 200 based on the random data rdmV to change the next RHR period. With such setting, the random signal rdm can be updated timely after a RHR operation is completed, thereby preparing for the next time of controlling RHR signal RHRPre to be in the active state.

In some embodiments, after the RHR signal RHRPre changes from the active state to the inactive state, the random module 200 updates the random signal rdm output by the output terminal of the random module 200 according to the random data rdmV and the refresh count signal CBR.

After the RHR signal RHRPre changes from the active state to the inactive state, the random module 200 updates the random data rdmV and processes the refresh count signal CBR under the control of the updated random data rdmV to output the random signal rdm.

In the above technical solution, the control circuit includes the random module 200 and the output module 100. The control terminal of the random module 200 is connected to the output terminal of the output module 100, and the output terminal of the random module 200 is connected to the second input terminal of the output module 100. The random module 200 processes the refresh count signal CBR and the random data rdmV based on the RHR signal RHRPre output by the output module 100 to obtain and output the random signal rdm. The output module 100 generates and outputs the RHR signal RHRPre based on the random signal rdm and the refresh count signal CBR. The maximum count value of the refresh count signal CBR is used for determining a fixed RHR frequency, and the frequency of the RHR signal RHRPre is changed by the random signal rdm on the basis of the fixed RHR frequency, thereby reducing the risk of hackers changing stored data by using the row hammer attack.

In some embodiments, continue to reference to FIG. 1, the output module 100 includes a period control signal generating unit 110 and a RHR signal generating unit 120. The period control signal generating unit 110 includes a first input terminal, a second input terminal, and an output terminal, and the RHR signal generating unit 120 includes a first input terminal, a second input terminal, a first output terminal, and a second output terminal.

The first input terminal of the period control signal generating unit 110 receives the refresh count signal CBR, the second input terminal of the period control signal generating unit 110 is connected to the second output terminal of the RHR signal generating unit 120, and the period control signal generating unit 110 generates a period control signal Ct based on a complementary RHR signal RHRPreB output by the RHR signal generating unit 120 and the refresh count signal CBR. The refresh count signal CBR controls a starting time when the period control signal Ct is in the active state, and the complementary RHR signal RHRPreB controls an ending time when the period control signal Ct is in the active state.

The first input terminal of the RHR signal generating unit 120 is connected to the output terminal of the random module 200, and the second input terminal of the RHR signal generating unit 120 is connected to the output terminal of the period control signal generating unit 110. The RHR signal generating unit 120 generates the RHR signal RHRPre and the complementary RHR signal RHRPreB according to the period control signal Ct and the random signal rdm. The first output terminal of the RHR signal generating unit 120 outputs the RHR signal RHRPre, and the second output terminal of the RHR signal generating unit 120 outputs the complementary RHR signal RHRPreB. The RHR signal RHRPre and the complementary RHR signal RHRPreB are inverted signals.

The starting time of the active state of the period control signal Ct is the time when a count value represented by the refresh count signal CBR is a set value. The refresh counter continues to count and outputs the latest refresh count signal CBR. In such case, the period control signal Ct continues to remain in the active state and waits for the random signal rdm to be in the active state. When the random signal rdm is in the active state, the RHR signal RHRPre output by the RHR signal generating unit 120 is also in the active state. When the random signal rdm changes from the active state to the inactive state, the RHR signal RHRPre output by the RHR signal generating unit 120 also changes from the active state to the inactive state. With such setting, the fixed RHR frequency is determined by the refresh count signal CBR, and the amount of addition and subtraction for the RHR frequency are controlled by controlling the count time when the random signal is in the active state, and further, the RHR signal RHRPre is generated based on the refresh count signal CBR and the random signal rdm, so as to perform random addition and subtraction on the fixed RHR frequency, thereby changing the RHR frequency.

When the RHR signal RHRPre changes from the active state to the inactive state, the period control signal Ct is also controlled to change from the active state to the inactive state. That is, the ending time of the active state of the period control signal Ct is the ending time of the active state of the RHR signal RHRPre. In such case, the RHR signal RHRPre cannot be controlled to be in an active state even if the random signal rdm is in an active state within the duration from the time when the current RHR operation is completed to the starting time of the next fixed RHR frequency, thereby avoiding multiple random RHR operations within a fixed RHR frequency and further causing the RHR frequency to become too large because the period control signal Ct continues to be at a high level after the RHR operation.

In some embodiments, continue to reference to FIG. 1, the period control signal generating unit 110 includes a starting trigger circuit 310, a termination trigger circuit 320 and a first latch 330. An output terminal of the starting trigger circuit 310 is connected to a first input terminal of the first latch 330, an output terminal of the termination trigger circuit 320 is connected to a second input terminal of the first latch 330, and an output terminal of the first latch 330 outputs the period control signal Ct.

An input terminal of the starting trigger circuit 310 receives the refresh count signal CBR. The starting trigger circuit 310 generates a starting trigger signal St based on the refresh count signal CBR, and the starting trigger signal St is used for determining the starting time of the active state of the period control signal Ct.

In some embodiments, when the count value represented by the refresh count signal CBR is a set value, the starting trigger signal St is in an active state. With this setting, the starting trigger signal St is in the active state at the starting time of the fixed RHR frequency, so as to control the period control signal Ct to be in the active state at the starting time of the fixed RHR frequency, and prepare for controlling the next RHR frequency.

In some embodiments, when the count value represented by the refresh count signal CBR is zero, the starting trigger signal St is in the active time.

An input terminal of the termination trigger circuit 320 is connected to the second output terminal of the RHR signal generating unit 120. The termination trigger circuit 320 generates a termination trigger signal Sp according to the complementary RHR signal RHRPreB, and the termination trigger signal Sp is used for determining the ending time of the active state of the period control signal Ct.

In some embodiments, the RHR signal RHRPre is in an active state when being in a high level, and the RHR signal RHRPre is in an inactive state when being in a low level. The complementary RHR signal RHRPreB is in an active state when being in a low level, and the complementary RHR signal RHRPre is in an inactive state when being in a high level. The termination trigger circuit 320 makes the output termination trigger signal Sp to be in the active state when the complementary RHR signal RHRPreB is in a rising edge. With this setting, after the RHR operation is performed, the period control signal Ct is changed into an inactive state timely.

The first latch 330 generates the period control signal Ct according to the starting trigger signal St and the termination trigger signal Sp. When the starting trigger signal St is in an active state, the first latch 330 makes the period control signal Ct to be in an active state and continues to maintain the period control signal Ct in the active state when the starting trigger signal St is in an inactive state. When the termination trigger signal Sp is in an active state, the first latch 330 makes the period control signal Ct to be in an inactive state and continues to maintain the period control signal Ct in the inactive state when the termination trigger signal Sp is in an inactive state.

In the above technical solution, the period control signal generating unit 110 includes the starting trigger circuit 310, the termination trigger circuit 320 and the first latch 330. The starting trigger circuit 310 makes the starting trigger signal St to be in an active state when the refresh count signal CBR represents a set value, and controls the period control signal Ct output by the first latch 330 to be in an active state, so as to enter the preparation stage at the starting time of the fixed RHR frequency. When waiting for the random signal rdm to be in the active state, the RHR signal RHRPre output by the RHR signal generating unit 120 is controlled to be in the active state.

In some embodiments, continue to reference to FIG. 1, the refresh count signal CBR includes a plurality of count sub-signals. The starting trigger circuit 310 includes an OR gate 311. The number of input terminals of the OR gate 311 is the same as the number of count sub-signals. Each input terminal of the OR gate 311 receives one of the count sub-signals, and the OR gate 311 outputs the starting trigger signal St after performing OR operation on the plurality of count sub-signals.

The starting trigger signal St is in an active state when being in a low level, and the starting trigger signal St is in an inactive state when being in a high level. When the count value represented by the refresh count signal CBR is zero, each count sub-signal of the refresh count signal CBR is in a low level, and the OR gate 311 makes the output starting trigger signal St to be in a low level. When the count value represented by the refresh count signal CBR is non-zero, at least one count sub-signal of the refresh count signal CBR is in a high level, and the OR gate 311 makes the output starting trigger signal St to be in a high level. With this setting, the starting trigger signal St is controlled to be in a low level when the count value represented by the refresh count signal CBR is zero, and the starting trigger signal St is controlled to be in a high level when the count value represented by the refresh count signal CBR is not zero.

Figure 2A:
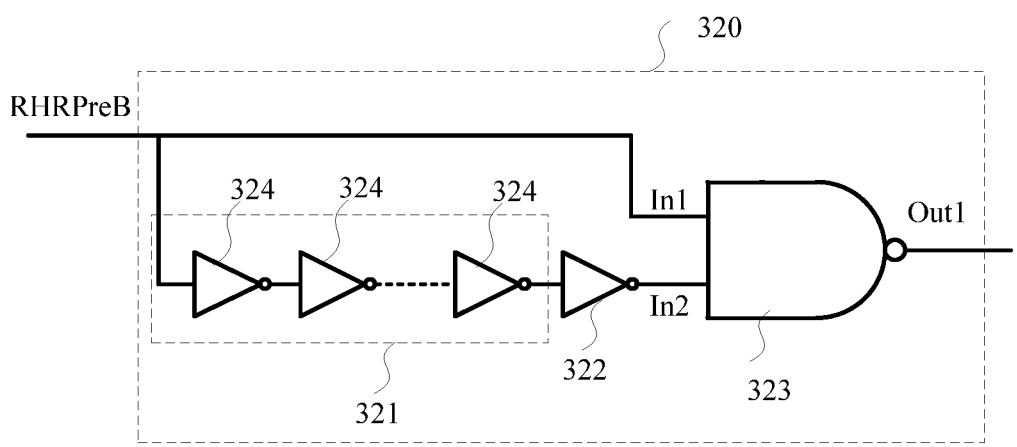
FIG. 2A is a schematic diagram of a termination trigger circuit according to an embodiment of the present disclosure.
Figure 2B:
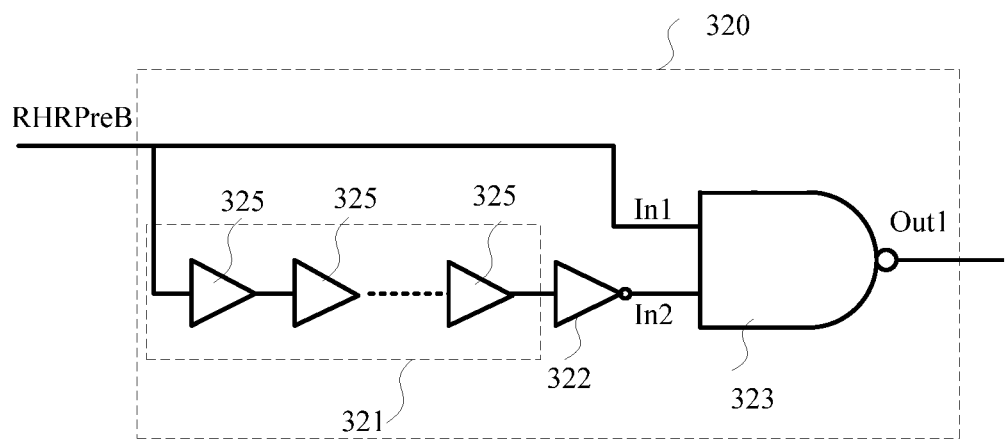
FIG. 2B is a schematic diagram of another termination trigger circuit according to an embodiment of the present disclosure.

In some embodiments, as illustrated in FIG. 2A and FIG. 2B, the termination trigger circuit 320 includes a first delay circuit 321, a first inverter 322 and a first NAND gate 323.

An input terminal of the first delay circuit 321 is connected to a first input terminal In1 of the first NAND gate 323, and an output terminal of the first delay circuit 321 is connected to an input terminal of the first inverter 322. An output terminal of the first inverter 322 is connected to a second input terminal In2 of the first NAND gate 323, and the first input terminal In1 of the first NAND gate 323 is connected to the second output terminal of the RHR signal generating unit 120.

The first input terminal In1 of the first NAND gate 323 receives the complementary RHR signal RHRPreB. The first delay circuit 321 delays the complementary RHR signal RHRPreB. The first inverter 322 performs NOT logic operation on the delayed complementary RHR signal RHRPreB and outputs the signal. The first NAND gate 323 performs NAND logic operation on the complementary RHR signal RHRPreB and the complementary RHR signal RHRPreB subjected to the NOT logic operation and delay process, and outputs the termination trigger signal Sp.

Figure 3:
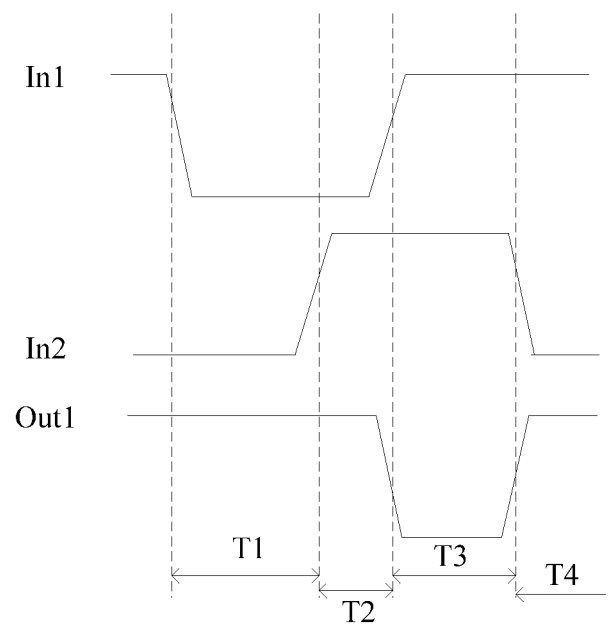
FIG. 3 is a timing diagram of a termination trigger circuit according to an embodiment of the present disclosure.

As illustrated in FIG. 3, the output terminal of the first NAND gate 323 outputs a high level during the first time period T1, the second time period T2 and the fourth time period T4. In the third time period T3, the output terminal of the first NAND gate 323 outputs a low level.

The termination trigger signal Sp is an active-low signal, and the output terminal of the first NAND gate 323 outputs a low level in the third time period T3, thereby enabling the output termination trigger signal Sp to be in a low level when the complementary RHR signal RHRPreB is in a rising edge.

In some embodiments, the delay amount of the first delay circuit 321 enables the termination trigger signal to be switched from the active state to the inactive state timely before the count value represented by the refresh count signal is a set value. This setting avoids the case that the starting trigger signal St cannot make the period control signal Ct active timely because the termination trigger signal Sp is still in the active state when the count value represented by the refresh count signal CBR is a preset value.

In some embodiments, continue to reference to FIG. 2A, the first delay circuit 321 includes an even number of fourth inverters 324 connected in cascade. An input terminal of the first fourth inverter 324 receives the complementary RHR signal RHRPreB, an output terminal of the first fourth inverter 324 is connected to an input terminal of the second fourth inverter 324, an output terminal of the second fourth inverter 324 is connected to an input terminal of the third fourth inverter 324, and so on, an output terminal of the second-to-last fourth inverter 324 is connected to an input terminal of the last fourth inverter 324, and an output terminal of the last fourth inverter 324 outputs the delayed complementary RHR signal RHRPreB.

In some embodiments, as illustrated in FIG. 2B, the first delay circuit 321 includes a plurality of first buffers 325 connected in cascade. An input terminal of the first buffer 325 at the first end receives the complementary RHR signal RHRPreB, an output terminal of the first buffer 325 at the first end is connected to an input terminal of the second first buffer 325, an output terminal of the second first buffer 325 is connected to an input terminal of the third first buffer 325, and so on, an output terminal of the second-to-last first buffer 325 is connected to an input terminal of the last first buffer 325, and an output terminal of the last first buffer 325 outputs the delayed complementary RHR signal RHRPreB.

In some embodiments, continue to reference to FIG. 1, the first latch 330 includes a second NAND gate 331 and a third NAND gate 332.

A first input terminal of the second NAND gate 331 serves as a first input terminal of the first latch 330, a second input terminal of the second NAND gate 331 is connected to an output terminal of the third NAND gate 332, and an output terminal of the second NAND gate 331 serves as an output terminal of the first latch 330. A first input terminal of the third NAND gate 332 is connected to the output terminal of the second NAND gate 331, and a second input terminal of the third NAND gate 332 serves as a second input terminal of the first latch 330.

TABLE 1

Truth table of the first latch

| R | S | Q(n) |
|---|---|------|
| 0 | 1 | 1 |
| 1 | 0 | 0 |
| 1 | 1 | Q(n−1) |

As illustrated in Table 1, the first input terminal of the first latch is marked as R, the second input terminal is marked as S, the state of the output terminal at the previous time is marked as Q (n−1), and the state of the output terminal at the current time is marked as Q (n). "1" represents a high level, and "0" represents a low level.

Figure 4:
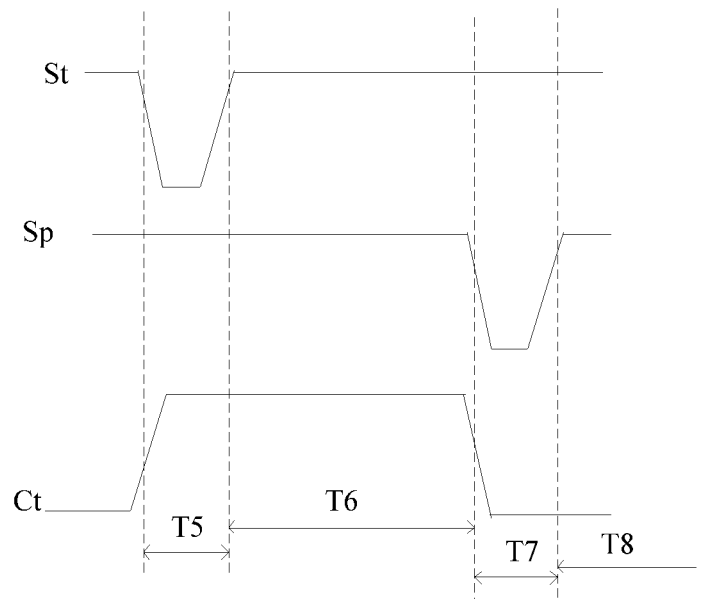
FIG. 4 is a timing schematic diagram of a first latch circuit according to an embodiment of the present disclosure.

As illustrated in FIG. 4, both the starting trigger signal St and the termination trigger signal Sp are active-low signals, and the period control signal Ct is an active-high signal. The time when the starting trigger signal St is in the low level is earlier than the time when the termination trigger signal Sp is in the low level.

In the fifth time period T5, when the starting trigger signal St is in the active state, the termination trigger signal Sp is in the inactive state, that is, the first input terminal R of the first latch 330 is in the low level, the second input terminal S is in the high level, and the period control signal Ct output by the first latch 330 is in the high level and is in the active state.

In the sixth time period T6, when the starting trigger signal St is in the inactive state, and the termination trigger signal Sp remains the inactive state, that is, the first input terminal R and the second input terminal S of the first latch 330 are both in the high level, the output terminal of the first latch 330 maintains the previous state and continues to maintain the period control signal Ct in the active state.

In the seventh time period T7, when the termination trigger signal Sp changes from the inactive state to the active state, the starting trigger signal St is in the inactive state, that is, the first input terminal R of the first latch 330 is in the high level, the second input terminal S is in the low level, and the period control signal Ct output by the first latch 330 is in the low level and is in the inactive state.

In the eighth time period T8, when the termination trigger signal Sp is in the inactive state, and the starting trigger signal St remains the inactive state, that is, when both the first input terminal R and the second input terminal S of the first latch 330 are in the high level, the output terminal of the first latch 330 maintains the previous state, and continues to maintain the period control signal Ct in the inactive state.

Figure 5:
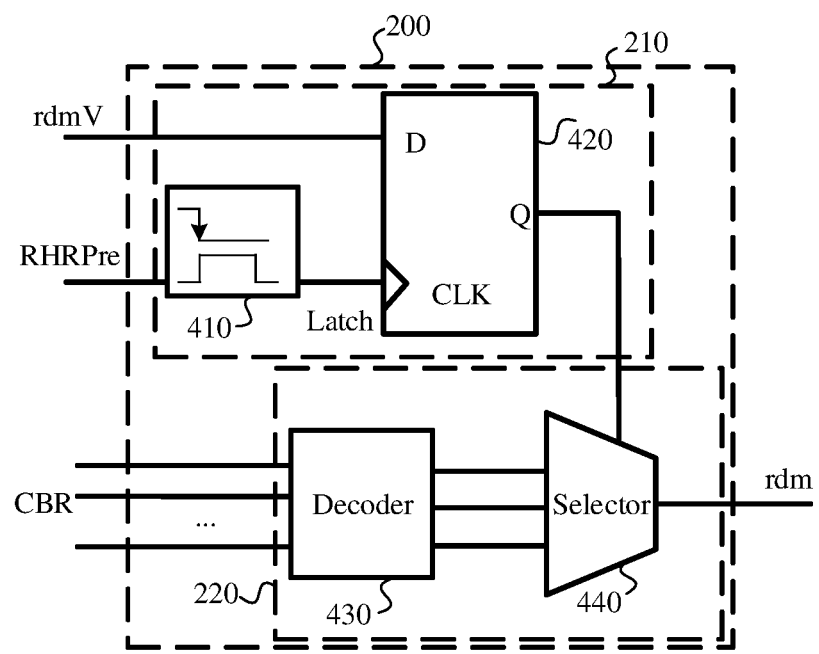
FIG. 5 is a schematic diagram of a random module according to an embodiment of the present disclosure.

In some embodiments, referring to FIG. 5, the random module 200 includes a control unit 210 and a random signal generating unit 220. The control unit 210 includes an input terminal, a control terminal and an output terminal. The random signal generating unit 220 includes a control terminal, an input terminal and an output terminal.

The input terminal of the control unit 210 receives the random data rdmV, the control terminal of the control unit 210 is connected to the output terminal of the output module 100, and the output terminal of the output module 100 is connected to the control terminal of the random signal generating unit 220.

The control unit 210 outputs the random data rdmV after the RHR signal RHRPre changes from an active state to an inactive state, and the random signal generating unit 220 generates a random signal rdm according to the refresh count signal CBR under the control of the random data rdmV. By using this setting, the random signal rdm is updated timely after one RHR operation is completed, so as to prepare for next control of the RHR signal RHRPre to be an active state and to change the RHR frequency by performing random addition and subtraction on a fixed RHR frequency.

In some embodiments, the random signal generating unit 220 enables the output random signal rdm to be in an active state when determining that the count value represented by the refresh count signal CBR is random data rdmV. The random signal generating unit 220 enables the output random signal rdm to be in an inactive state when determining that the count value represented by the refresh count signal CBR is not the random data rdmV. With this setting, controlling the time when the random signal rdm is in an active state can control to add or subtract values from the fixed RHR frequency, to change the RHR frequency.

In some embodiments, referring to FIG. 5, the control unit 210 includes a first trigger circuit 410 and a second latch 420. The first trigger circuit 410 includes an input terminal and an output terminal, and the second latch 420 includes a clock terminal, an input terminal and an output terminal.

The input terminal of the first trigger circuit 410 is connected to the output terminal of the output module 100, and the output terminal of the first trigger circuit 410 is connected to the clock terminal of the second latch 420. The first trigger circuit 410 generates a first trigger signal latch based on the RHR signal RHRPre. The input terminal of the second latch 420 receives the random data rdmV, and the second latch 420 outputs the received random data rdmV under the control of the first trigger signal latch.

In some embodiments, the first trigger circuit 410 enables the output first trigger signal latch to be in an active state after the RHR signal RHRPre changes from an active state to an inactive state. With this setting, the random data rdmV for controlling the output of the second latch 410 is updated timely after one RHR operation is completed, and the time when the random signal rdm is in an active state is changed, to make preparation for the next control of RHR signal RHRPre to be in the active state.

Figure 6A:
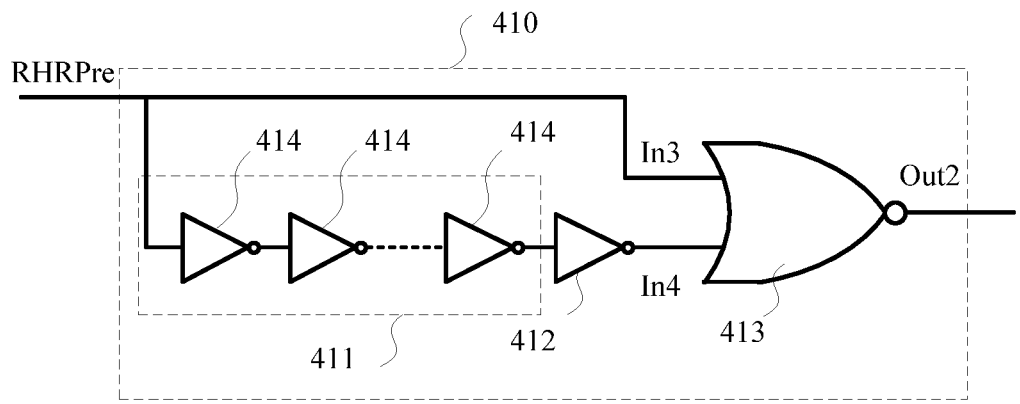
FIG. 6A is a schematic diagram of a first trigger circuit according to an embodiment of the present disclosure.
Figure 6B:
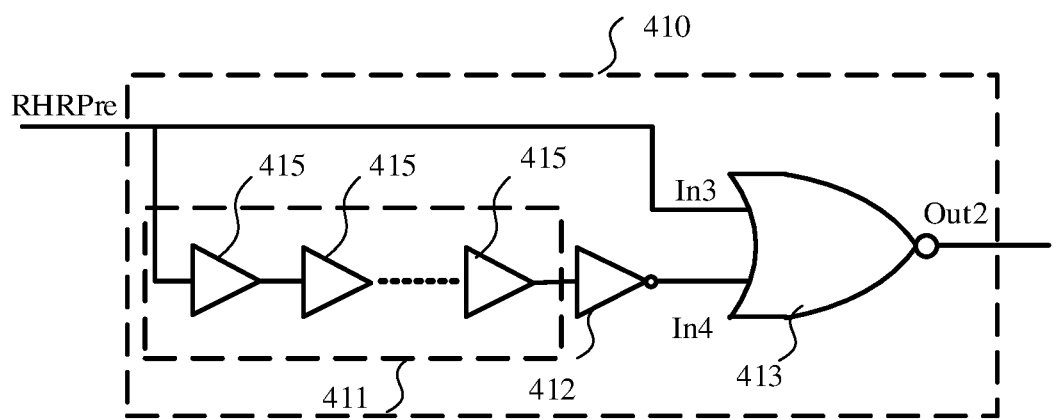
FIG. 6B is a schematic diagram of another first trigger circuit according to an embodiment of the present disclosure.

In some embodiments, referring to FIG. 6A and FIG. 6B, the first trigger circuit 410 includes a second delay circuit 411, a second inverter 412 and a NOR gate 413. The second delay circuit 411 is provided with an input terminal and an output terminal, the second inverter 412 is provided with an input terminal and an output terminal, and the NOR gate 413 is provided with a first input terminal In3, a second input terminal In4, and an output terminal Out2.

The input terminal of the second delay circuit 411 is connected to the first input terminal In3 of the NOR gate 413, and the output terminal of the second delay circuit 411 is connected to the input terminal of the second inverter 412. The output terminal of the second inverter 412 is connected to the second input terminal In4 of the NOR gate 413.

The first input terminal of the NOR gate 413 is connected to the first output terminal of the RHR signal generating unit 120 and the second input terminal of the NOR gate 413 is connected to the output terminal of the second inverter 412. The first input terminal of the NOR gate 413 receives the RHR signal RHRPre. The second delay circuit 411 delays the RHR signal RHRPre. The second inverter 412 outputs the RHR signal RHRPre subjected to the delay process and the NOT logic operation. The NOR gate 413 processes the RHR signal RHRPre and the RHR signal RHRPre subjected to the delay process and the NOT logic operation, and outputs the first trigger signal latch.

Figure 7:
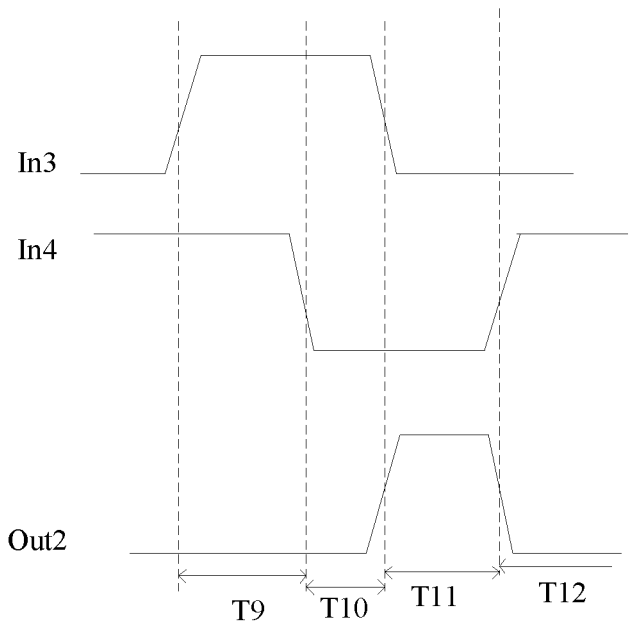
FIG. 7 is a timing diagram of a first trigger circuit according to an embodiment of the present disclosure.
Figure 8:
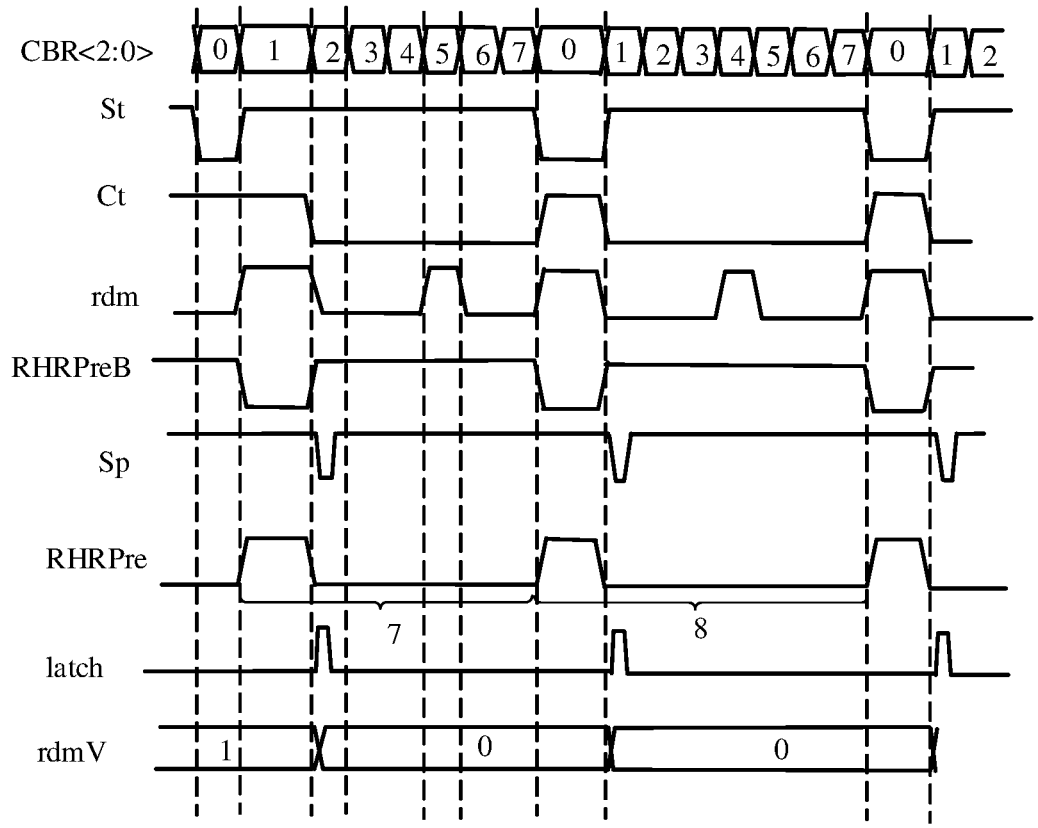
FIG. 8 is a timing diagram of a control circuit according to an embodiment of the present disclosure.

As illustrated in FIG. 7, the output terminal of the NOR gate 413 outputs a low level in the ninth time period T9, the tenth time period T10 and the twelfth time period T12. In the eleventh time period T11, the output terminal of the NOR gate 413 outputs a high level.

The first trigger signal latch is an active-high signal. The output terminal of the NOR gate 413 outputs a high level in the eleventh time interval T11, such that the output first trigger signal latch is at the high level when the RHR signal RHRPre is in a falling edge.

In some embodiments, referring to FIG. 6A, the second delay circuit 411 includes an even number of fifth inverters 414 connected in cascade. An input terminal of the first fifth inverter receives the RHR signal RHRPre, an output of the first fifth inverter is connected to an input terminal of the second fifth inverter 414, an output terminal of the second fifth inverter 414 is connected to an input terminal of the third fifth inverter 414, and so on, an output terminal of the second-to-last fifth inverter 414 is connected to an input terminal of the last fifth inverter 414, and an output terminal of the last fifth inverter 414 outputs the delayed RHR signal RHRPre.

In some embodiments, referring to FIG. 6B, the second delay circuit 411 includes a plurality of second buffers 415 connected in cascade. An input terminal of the first second buffer 415 receives the RHR signal RHRPre, an output terminal of the first second buffer 415 is connected to an input terminal of the second second buffer 415, an output terminal of the second second buffer 415 is connected to an input terminal of the third second buffer 415, and so on, an output terminal of the second-to-last second buffer 415 is connected to an input terminal of the last second buffer 415, and an output terminal of the last second buffer 415 outputs the delayed RHR signal RHRPre.

In some embodiments, continue to reference to FIG. 1, the RHR signal generating unit 120 includes a fourth NAND gate 121 and a third inverter 122. A first input terminal of the fourth NAND gate 121 is connected to the output terminal of the random module 200, a second input terminal of the fourth NAND gate 121 is connected to the output terminal of the period control signal generating unit 110, and an output terminal of the fourth NAND gate 121 serves as the second output terminal of the RHR signal generating unit 120 to output the complementary RHR signal RHRPreB. An input terminal of the third inverter 122 is connected to the fourth NAND gate 121, and an output terminal of the third inverter 122 serves as the first output terminal of the RHR signal generating unit 120 to output the RHR signal RHRPre.

The RHR signal RHRPre, the period control signal Ct, and the random signal rdm are active-high signals, and the complementary RHR signal RHRPreB is an active-low signal. The period control signal Ct is in the high level when the count value represented by the refresh count signal CBR is a set value, and waits for the random signal rdm to be in the high level. When the random signal rdm is in the high level, the fourth NAND gate 121 outputs a low level to control the complementary RHR signal RHRPreB output by the fourth NAND gate 121 to be in an active state, and the RHR signal RHRPre is in the high level after the NOT logic operation is performed by the third inverter 122.

When the random signal rdm is in a low level during the period when the period control signal Ct is in a high level, or when the period control signal Ct is in a high level, the fourth NAND gate 121 outputs a high level, to control the complementary RHR signal RHRPreB output by the fourth NAND gate 121 to be in an inactive state, and after the NOT logic operation is performed by the third inverter 122, the RHR signal RHRPre is in a low level, i.e., the inactive state. With this setting, the period control signal Ct received by the second input terminal of the fourth NAND gate 121 is controlled to be in the active state, and when the random signal rdm received by the first input terminal of the fourth NAND gate 121 is in the active state, the fourth NAND gate 121 controls the RHR signal RHRPre output by the third inverter 122 to be in the active state.

In some embodiments, referring to FIG. 5, the random signal generating unit 220 includes a decoder 430 and a selector 440. An input terminal of the decoder 430 receives the refresh count signal CBR. An output terminal of the decoder 430 is connected to an input terminal of the selector 440, and a control terminal of the selector 440 is connected to the output terminal of the control unit 210.

When the decoder 430 operates in the first decoding mode, the decoder decodes the decoded bits of the refresh count signal CBR to output a first identification signal and a second identification signal, and the selector 440 selects one of the first identification signal and the second identification signal for outputting according to the random data rdmV.

When the count value represented by the decoded bits of the refresh count signal CBR is a count value represented by the first identification signal, the first identification signal is in an active state. When the count value represented by the decoded bits of the refresh count signal CBR is not the count value represented by the first identification signal, the first identification signal is in an inactive state. When the count value represented by the decoded bits of the refresh count signal CBR is a count value represented by the second identification signal, the second identification signal is in an active state. When the count value represented by the decoded bits of the refresh count signal CBR is not the count value represented by the second identification signal, the second identification signal is in an inactive state.

In some embodiments, the count value represented by the first identification signal is different from the count value represented by the second identification signal.

In some embodiments, the first identification signal, the second identification signal and the random signal rdm are all active-high signals.

In some embodiments, the count value represented by the first identification signal is 0. A difference between the count value represented by the first identification signal and the count value represented by the second identification signal is 1, 2, or 3.

For example, the refresh count signal CBR includes three data bits, and the refresh count signal CBR is marked as CBR<2:0>. The decoded bits of the refresh count signal CBR are the first bit signal and the second bit signal ordered from low to high, and the decoded bits are marked as CBR<1:0>. The count value represented by the first identification signal is 0, and the count value represented by the second identification signal is 1.

When the refresh count signal CBR is 000, the first identification signal output after decoding the refresh count signal CBR is in an active state, and when the refresh count signal CBR is a signal other than 000, the first identification signal is in an inactive state.

When the refresh count signal CBR is 001 or 101, the second identification signal output after decoding the refresh count signal CBR is in an active state, and when the refresh count signal CBR is a signal other than 001 and 101, the second identification signal is in an inactive state.

In some embodiments, the random signal generating unit 220 further includes a controller. The decoder 430 further outputs a first identification signal, a second identification signal and a third identification signal when the decoder 430 operates in the second decoding mode. The controller controls the selector 440 to select one of the first identification signal, the second identification signal and the third identification signal for outputting according to the random data rdmV when the decoder 430 operates in the second decoding mode.

The third identification signal is in an active state when the count value represented by the decoded bits of the refresh count signal CBR is the count value represented by the third identification signal. The third identification signal is in an inactive state when the count value represented by the decoded bits of the refresh count signal CBR is not the count value represented by the third identification signal.

The count value represented by the first identification signal, the count value represented by the second identification signal and the count value represented by the third identification signal are different from each other. A difference between the count value represented by the first identification signal and the count value represented by the third identification signal is 1, 2, or 3.

In some embodiments, the decoder 430 further outputs a first identification signal, a second identification signal, a third identification signal and a fourth identification signal when the decoder 430 operates in the third decoding mode. The controller controls the selector 440 to select one of the first identification signal, the second identification signal, the third identification signal and the fourth identification signal for outputting according to the random data rdmV when the decoder 430 operates in the third decoding mode.

The fourth identification signal is in an active state when the count value represented by the decoded bits of the refresh count signal CBR is the count value represented by the fourth identification signal. The fourth identification signal is in an inactive state when the count value represented by the decoded bits of the refresh count signal CBR is not the count value represented by the fourth identification signal. The count value represented by the first identification signal, the count value represented by the second identification signal, the count value represented by the third identification signal and the count value represented by the fourth identification signal are different from each other. A difference between the count value represented by the first identification signal and the count value represented by the fourth identification signal is 1, 2, or 3

The principle of the control circuit illustrated in FIG. 1 and FIG. 4 is described below by taking the refresh counter being a 3-bit counter and the output refresh count signal CBR being marked as CBR<2:0> as an example.

The decoder operates in the second decoding mode. The decoded bits of the refresh count signal CBR are the first bit signal and the second bit signal ordered from low to high, and the decoded bits are marked as CBR<1:0>. The count value represented by the first identification signal is 0, the count value represented by the second identification signal is 1, and the count value represented by the third identification signal is 2.

As illustrated in FIG. 7, when the refresh count signal CBR is 000, the starting trigger signal St output by the starting trigger circuit 310 is in a low level, and the period control signal Ct output by the first latch 330 is in a high level.

For example, the random data rdmV output by the second latch 420 is 1, and the selector 440 selects and outputs the second identification signal. When the refresh count signal CBR is increased to 001, the second identification signal is in a high level, the random signal rdm output by the selector 440 is in a high level, the RHR signal RHRPre is in a high level, and the complementary RHR signal RHRPreB is in a low level.

When the refresh count signal CBR is 010, the second identification signal is in a low level, and the random signal rdm output by the selector 440 is in a low level. The RHR signal RHRPre changes from the high level to the low level, the first trigger signal latch output by the first trigger circuit 410 is in an active state, the second latch 420 updates the random data rdmV to 0, and the selector 440 selects the first identification signal for outputting. The complementary RHR signal RHRPreB changes from the low level to the high level, the termination trigger signal Sp output by the termination trigger circuit 320 is in an active state, and the period control signal Ct output by the first latch 330 is in a low level.

When the refresh count signal CBR is increased to 100, the first identification signal is in a high level and the random signal rdm output by the selector 440 is in a high level. In such case, however, the period control signal Ct is in a low level, the RHR signal RHRPre is in a low level, and the complementary RHR signal RHRPreB is in a high level.

When the refresh count signal CBR is changed to 000 again, the period control signal Ct output by the first latch 330 is in a high level, and the first identification signal is in a high level. The random signal rdm output by the selector 440 is in a high level, the RHR signal RHRPre is in a low level, and the complementary RHR signal RHRPreB is in a high level.

That is, when the random data rdmV output by the second latch 420 is 1, the selector 440 selects and outputs the second identification signal, and when the refresh count signal CBR is 001, the RHR signal RHRPre is in a high level. When the random data rdmV output by the second latch 420 becomes 0, the selector 440 selects and outputs the first identification signal, and when the refresh count signal CBR is 000, the RHR signal RHRPre is in a high level. The RHR frequency becomes 1/7, and the RHR frequency is subtracted by 1 from the fixed refresh frequency of 1/8.

For another example, when the random data rdmV output by the second latch 420 is 0, the selector 440 selects and outputs the first identification signal, and when the refresh count signal CBR is 000, the RHR signal RHRPre is in a high level. When the random data rdmV output by the second latch 420 becomes 1, the selector 440 selects and outputs the second identification signal, and when the refresh count signal CBR is 001, the RHR signal RHRPre is in a high level. The RHR frequency becomes 1/9, and the RHR frequency is added to the fixed refresh frequency 1/8 by 1.

For another example, when the random data rdmV output by the second latch 420 is 2, the selector 440 selects and outputs the third identification signal, and when the refresh count signal CBR is 010, the RHR signal RHRPre is in a high level. When the random data rdmV output by the second latch 420 becomes 0, the selector 440 selects and outputs the first identification signal, and when the refresh count signal CBR is 000, the RHR signal RHRPre is in a high level. The RHR frequency becomes 1/6, and the RHR frequency is subtracted by 2 from the fixed refresh frequency 1/8.

For another example, when the random data rdmV output by the second latch 420 is 0, the selector 440 selects and outputs the first identification signal, and when the refresh count signal CBR is 000, the RHR signal RHRPre is in a high level. When the random data rdmV output by the second latch 420 becomes 2, the selector 440 selects and outputs the third identification signal, and when the refresh count signal CBR is 010, the RHR signal RHRPre is in a high level. The RHR frequency becomes 1/10, and the RHR frequency is added to the fixed refresh frequency 1/8 by 2.

For another example, when the random data rdmV output by the second latch 420 is 2, the selector 440 selects and outputs the third identification signal, and when the refresh count signal CBR is 010, the RHR signal RHRPre is in a high level. When the random data rdmV output by the second latch 420 becomes 2, the selector 440 selects and outputs the third identification signal, and when the refresh count signal CBR is 010, the RHR signal RHRPre is in a high level. The RHR frequency becomes 1/8, and the RHR frequency remains unchanged.

In the above technical solutions, the count values represented by the first identification signal to the third identification signal are set as 0, 1 and 2, respectively when the first identification signal to the third identification signal are in the active state, and any one of the first identification signal, the second identification signal and the third identification signal is selected for outputting by using the random data rdmV, such that the random addition and subtraction can be controlled to be 0, 1 and 2.

Correspondingly, the count values represented by the first identification signal to the fourth identification signal are set as 0, 1, 2 and 3, respectively when the first identification signal to the fourth identification signal are in the active state, and any one of the first identification signal, the second identification signal, the third identification signal and the fourth identification signal is selected for outputting by using the random data rdmV, such that the random addition and subtraction can be controlled to be 0, 1, 2, and 3.

Correspondingly, the count values represented by the first identification signal and the second identification signal are set as 0 and 2, respectively when the first identification signal and the second identification signal are in the active state, and any one of the first identification signal and the second identification signal is selected for outputting by using the random data rdmV, such that the random addition and subtraction can be controlled to be 0 and 2.

In the above technical solutions, the count values represented by the first identification signal to the fourth identification signal when the first identification signal to the fourth identification signal are in the active state are set, and any one of the first identification signal, the second identification signal, the third identification signal and the fourth identification signal is selected for outputting by using the random data rdmV, so as to control the random addition and subtraction amount.

An embodiment of the present disclosure also provides a memory including the control circuit in the above embodiments.

Other implementations of the present disclosure will be apparent to those skilled in the art from consideration of the specification and practice of the present disclosure. The present disclosure is intended to cover any variations, uses, or adaptations of the present disclosure following the general principles thereof and including such departures from the present disclosure as come within known or customary practice in the art. The specification and embodiments are considered as exemplary only, and the true scope and concept of the present disclosure are indicated by the following claims.

It should be understood that the present disclosure is not limited to the precise structure described above and illustrated in the drawings, and various modifications and changes may be made without departing from the scope of the present disclosure. The scope of the present disclosure is subject only to the appended claims.

The invention claimed is:

1. A control circuit, comprising: a random module and an output module, wherein
   a first input terminal of the random module receives a refresh count signal, a second input terminal of the random module receives random data, and a control terminal of the random module is connected to an output terminal of the output module, and the random module is configured to process the refresh count signal and the random data based on a row hammer refresh (RHR) signal output by the output module to obtain and output a random signal; and
   a first input terminal of the output module receives the refresh count signal, a second input terminal of the output module is connected to an output terminal of the random module, and the output module is configured to generate and output the RHR signal according to the random signal and the refresh count signal.

2. The control circuit of claim 1, wherein the output module comprises a period control signal generating unit and a RHR signal generating unit, wherein:
   a first input terminal of the period control signal generating unit receives the refresh count signal, a second input terminal of the period control signal generating unit is connected to a second output terminal of the RHR signal generating unit, and the period control signal generating unit is configured to generate a period control signal according to a complementary RHR signal output by the RHR signal generating unit and the refresh count signal; and
   a first input terminal of the RHR signal generating unit is connected to the output terminal of the random module, a second input terminal of the RHR signal generating unit is connected to an output terminal of the period control signal generating unit, and the RHR signal generating unit is configured to generate the RHR signal and the complementary RHR signal according to the period control signal and the random signal, wherein a first output terminal of the RHR signal generating unit outputs the RHR signal, a second output terminal of the RHR signal generating unit outputs the complementary RHR signal, and the RHR signal and the complementary RHR are inverted signals.

3. The control circuit of claim 2, wherein a starting time of an active state of the period control signal is a time when a count value represented by the refresh count signal is a set value, and an ending time of the active state of the period control signal is an ending time of an active state of the RHR signal.

4. The control circuit of claim 3, wherein the period control signal generating unit comprises:
   a starting trigger circuit, having an input terminal for receiving the refresh count signal and configured to generate a starting trigger signal according to the refresh count signal, the starting trigger signal being used for determining the starting time of the active state of the period control signal;
   a termination trigger circuit, having an input terminal connected to the second output terminal of the RHR signal generating unit and configured to generate a termination trigger signal according to the complementary RHR signal, the termination trigger signal being used for determining the ending time of the active state of the period control signal; and
   a first latch, having a first input terminal connected to an output terminal of the starting trigger circuit, and a second input terminal connected to an output terminal of the termination trigger circuit, and configured to generate the period control signal according to the starting trigger signal and the termination trigger signal.

5. The control circuit of claim 4, wherein the refresh count signal comprises a plurality of count sub-signals, and the starting trigger circuit comprises: an OR gate,
   wherein a number of input terminals of the OR gate is the same as a number of the count sub-signals, each input terminal of the OR gate receives one of the count sub-signals, and the OR gate is configured to output the starting trigger signal after performing OR operation on the plurality of the count sub-signals.

6. The control circuit of claim 4, wherein the termination trigger circuit comprises a first delay circuit, a first inverter, and a first NAND gate, wherein
   an input terminal of the first delay circuit is connected to a first input terminal of the first NAND gate, an output terminal of the first delay circuit is connected to an input terminal of the first inverter, and the first delay circuit is configured to delay the complementary RHR signal;
   an output terminal of the first inverter is connected to a second input terminal of the first NAND gate; and
   the first input terminal of the first NAND gate is connected to the second output terminal of the RHR signal generating unit and outputs the termination trigger signal.

7. The control circuit of claim 4, wherein the first latch comprises a second NAND gate and a third NAND gate, wherein:
   a first input terminal of the second NAND gate serves as the first input terminal of the first latch, a second input terminal of the second NAND gate is connected to an output terminal of the third NAND gate, and an output terminal of the second NAND gate serves as an output terminal of the first latch; and
   a first input terminal of the third NAND gate is connected to the output terminal of the second NAND gate, and a second input terminal of the third NAND gate serves as the second input terminal of the first latch.

8. The control circuit of claim 2, wherein the RHR signal generating unit comprises:
a fourth NAND gate, having a first input terminal connected to the output terminal of the random module, a second input terminal connected to the output terminal of the period control signal generating unit, and an output terminal serving as the second output terminal of the RHR signal generating unit to output the complementary RHR signal; and
a third inverter, having an input terminal connected to the fourth NAND gate, and an output terminal serving as the first output terminal of the RHR signal generating unit to output the RHR signal.

9. The control circuit of claim 1, wherein the random module is configured to update the random signal output by the output terminal of the random module after the RHR signal changes from an active state to an inactive state.

10. The control circuit of claim 9, wherein the random module comprises:
a control unit, having an input terminal for receiving the random data and a control terminal connected to the output terminal of the output module, and configured to output the random data after the RHR signal changes from the active state to the inactive state; and
a random signal generating unit, having a control terminal connected to an output terminal of the control unit and an input terminal for receiving the refresh count signal, and configured to generate the random signal according to the refresh count signal under control of the random data.

11. The control circuit of claim 10, wherein the control unit comprises:
a first trigger circuit, having an input terminal connected to the output terminal of the output module, and configured to generate a first trigger signal according to the RHR signal; and
a second latch, having a clock terminal connected to an output terminal of the first trigger circuit and an input terminal for receiving the random data, and configured to output the random data under control of the first trigger signal.

12. The control circuit of claim 11, wherein the first trigger circuit comprises a second delay circuit, a second inverter, and a NOR gate, wherein:
an input terminal of the second delay circuit is connected to a first input terminal of the NOR gate, and an output terminal of the second delay circuit is connected to an input terminal of the second inverter, and the second delay circuit is configured to delay the RHR signal;
an output terminal of the second inverter is connected to a second input terminal of the NOR gate; and
the first input terminal of the NOR gate is connected to the output terminal of the output module, and the NOR gate is configured to output the first trigger signal.

13. The control circuit of claim 10, wherein the random signal generating unit comprises:
a decoder, having an input terminal for receiving the refresh count signal, and configured to output a first identification signal and a second identification signal when the decoder operates in a first decoding mode, wherein when the refresh count signal is a count value represented by the first identification signal, the first identification signal is in an active state, when the refresh count signal is a count value represented by the second identification signal, the second identification signal is in an active state, and the count value represented by the first identification signal is different from the count value represented by the second identification signal; and
a selector, having an input terminal connected to an output terminal of the decoder and a control terminal connected to the output terminal of the control unit, and configured to select and output one of the first identification signal and the second identification signal according to the random data.

14. The control circuit of claim 13, wherein the random signal generating unit further comprises: a controller;
wherein the decoder is further configured to output the first identification signal, the second identification signal and a third identification signal when the decoder operates in a second decoding mode, when the refresh count signal is a count value represented by the third identification signal, the third identification signal is in an active state, and the count value represented by the first identification signal, the count value represented by the second identification signal and the count value represented by the third identification signal are different from each other; and
wherein the controller is configured to control the selector to select and output one of the first identification signal, the second identification signal and the third identification signal according to the random data when the decoder operates in the second decoding mode.

15. The control circuit of claim 14, wherein a difference between the count value represented by the first identification signal and the count value represented by the second identification signal is 1, 2, or 3; and
a difference between the count value represented by the first identification signal and the count value represented by the third identification signal is 1, 2, or 3.

16. A memory, comprising a control circuit, wherein the control circuit comprises a random module and an output module, wherein
a first input terminal of the random module receives a refresh count signal, a second input terminal of the random module receives random data, and a control terminal of the random module is connected to an output terminal of the output module, and the random module is configured to process the refresh count signal and the random data based on a row hammer refresh (RHR) signal output by the output module to obtain and output a random signal; and
a first input terminal of the output module receives the refresh count signal, a second input terminal of the output module is connected to an output terminal of the random module, and the output module is configured to generate and output the RHR signal according to the random signal and the refresh count signal.

* * * * *